United States Patent
Lin et al.

(10) Patent No.: US 7,599,215 B2
(45) Date of Patent: Oct. 6, 2009

(54) MAGNETORESISTIVE RANDOM ACCESS MEMORY DEVICE WITH SMALL-ANGLE TOGGLE WRITE LINES

(75) Inventors: Wen-Chin Lin, Hsin-Chu (TW); Denny Tang, Saratoga, CA (US); Hsu Chen Cheng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 246 days.

(21) Appl. No.: 11/840,051

(22) Filed: Aug. 16, 2007

(65) Prior Publication Data

US 2008/0239794 A1    Oct. 2, 2008

Related U.S. Application Data

(60) Provisional application No. 60/909,235, filed on Mar. 30, 2007.

(51) Int. Cl.
G11C 11/15    (2006.01)
(52) U.S. Cl. .................. 365/158; 365/171; 365/173
(58) Field of Classification Search ............ 365/158, 365/171, 173
See application file for complete search history.

(56) References Cited

U.S. PATENT DOCUMENTS 6,515,341 B2    2/2003  Engel et al.
6,522,579 B2    2/2003  Hoenigschmid
6,545,906 B1    4/2003  Savtchenko et al.
6,633,498 B1   10/2003  Engel et al.
7,158,407 B2 *  1/2007  Rizzo et al. ................. 365/173

OTHER PUBLICATIONS

B. N. Engel, J. Akerman, B. Butcher, R. W. Dave, M. Deherrera, M. Durlam, G. Grynkewich, J. Janesky, S. V. Pietambaram, N. D. Rizzo, J. M. Slaughter, K. Smith, J. J. Sun, and S. Tehrani, A 4-Mb Toggle MRAM Based on a Novel Bit and Switching Method, IEEE Transactions on Magnetics, vol. 41., No. 1., Jan. 2005.

* cited by examiner

Primary Examiner—Son Dinh
Assistant Examiner—Nam Nguyen
(74) Attorney, Agent, or Firm—Baker & McKenzie LLP

(57) ABSTRACT

Disclosed herein are toggle-mode magnetoresistive random access memory (MRAM) devices having small-angle toggle write lines, and related methods of toggle-mode switching MRAM devices. Also disclosed are layouts for MRAM devices constructed according to the disclosed principles. Generally speaking, the disclosed principles provide for non-orthogonally aligned toggle-mode write lines used to switch toggle-mode MRAM devices that employ a bias field to decrease the threshold needed to switch the magnetic state of each device. While the conventional toggle-mode write lines provide for the desired orthogonal orientation of the applied magnetic fields to optimize device switching, the use of a bias field affects this orthogonal orientation. By non-orthogonally aligning the two write lines as disclosed herein, the detrimental affect of the bias field may be compensated for such that the net fields applied to the device for both lines are again substantially orthogonal, as is desired.

20 Claims, 10 Drawing Sheets

MAGNETORESISTIVE RANDOM ACCESS MEMORY DEVICE WITH SMALL-ANGLE TOGGLE WRITE LINES

CROSS-REFERENCE TO RELATED APPLICATION

This application claims the benefit of provisional U.S. Application No. 60/909,235, filed Mar. 30, 2007. The disclosure of this provisional application is hereby incorporated herein by reference in its entirety for all purposes.

TECHNICAL FIELD

This disclosure relates to magnetoresistive random access memory devices, and more particularly to toggle-mode magnetoresistive random access memory devices having small-angle toggle write lines.

BACKGROUND

Contrary to conventional memory devices, which use an electric charge to store data, a magnetoresistive random access memory ("MRAM") device stores data magnetically. The advantages of storing data magnetically include non-volatility, high-speed operation, and durability. Although an MRAM device has these advantages over conventional memory devices, its commercial viability still depends on whether technologies can continue to be developed to improve its power consumption, error rate, and stability of the memory state.

To store and retrieve data magnetically, an MRAM device is constructed to have a magnetic moment vector that switches between two stable orientations. Each stable orientation corresponds to one of two possible memory states of an MRAM device, and has a different electrical resistance. During a write operation, a magnetic field is applied to switch the magnetic moment vector to the desirable orientation. To read the stored data, a current is passed through the MRAM device to sense the electrical resistance and determine the corresponding memory state.

Several prior references have already disclosed improvements for the MRAM device. An improved method for writing to an MRAM device known as "toggle-mode" was developed and disclosed by Savtchenko et al. in U.S. Pat. No. 6,545,906. The toggle-mode write operation improves the stability of the memory state and the selectability of the write operation by using a rotating magnetic field to write to an MRAM device. Moreover, toggle-mode MRAM devices with improved power consumption are disclosed in U.S. Pat. No. 6,633,498 and U.S. Pat. No. 6,515,341. A disclosed device comprises an extra bias field that acts on the magnetic material in the MRAM device and reduces the power required to switch the orientation of the magnetic moment vector.

Despite the improvement in stability of memory state and power consumption, a new problem arises due to the use of an extra bias field in MRAM devices. The bias field not only reduces the switching field but also affects the rotating magnetic field during write operations, and this greatly increases the error rate. Thus, there exists a need for a toggle-mode MRAM device with reduced switching field and low error rate during write operations.

BRIEF SUMMARY

Disclosed herein are toggle-mode magnetoresistive random access memory (MRAM) devices having small-angle toggle write lines, and related methods of toggle-mode switching MRAM devices. Also disclosed are layouts for MRAM devices constructed according to the disclosed principles. Generally speaking, the disclosed principles provide for non-orthogonally aligned toggle-mode write lines used to switch toggle-mode MRAM devices that employ a bias field to decrease the threshold needed to switch the magnetic state of each device. While the conventional toggle-mode write lines provide for the desired orthogonal orientation of the applied magnetic fields to optimize device switching, the use of a bias field affects this orthogonal orientation. By non-orthogonally aligning the two write lines as disclosed herein, the detrimental affect of the bias field may be compensated for such that the net fields applied to the device for both lines are again substantially orthogonal, as is desired.

In one aspect, a toggle-mode MRAM device is disclosed. In one embodiment, the MRAM devices comprises a first write line extending along a first direction on a first plane, and a second write line extending along a second direction on a second plane that is parallel to the first plane, wherein the second direction is non-orthogonal to the first direction. In addition, this device includes a magnetoresistive memory element having a switchable magnetic state and disposed between the first and second write lines in an intersecting region located where the first and second write lines would intersect if located on the same plane. In such embodiments, the first write line is configured to provide a first magnetic field (H-Field) to the memory element when carrying a first write current, and the second write line is configured to provide a second H-Field to the memory element when carrying a second write current, the first and second H-Fields together sufficient to switch a magnetic state of the element when applied to the element in a predetermined arrangement.

In another aspect, an array of toggle-mode MRAM devices is disclosed. In one embodiment, the array comprises a plurality of magnetoresistive memory elements arranged in rows and columns, and each having a switchable magnetic state. The array further comprises first write lines extending along corresponding rows on a first plane, as well as second write lines extending along corresponding columns on a second plane that is parallel to the first plane. In such embodiments, each of the plurality of elements are disposed between corresponding pairs of the first and second write lines in a corresponding intersecting region located where a first write line would non-orthogonally intersect a second write line if located on the same plane. Also in such embodiments, each first write line is configured to provide a first H-Field to the memory elements when carrying a first write current, and each second write line is configured to provide a second H-Field to the memory elements when carrying a second write current, where the first and second H-Fields together are sufficient to switch a magnetic state of one of the elements when applied to that element in a predetermined arrangement.

In yet another embodiment, a method of toggle-mode switching an MRAM device is also disclosed. In one embodiment, the method comprises providing a first write current through a first write line in a first direction and on a first plane for applying a first H-Field to a memory element, and providing a second write current through a second write line in a second direction and on a second plane that is parallel to the first plane, wherein the second direction is non-orthogonal to the first direction, for applying a second H-Field to the memory element. In such methods, the first and second H-Fields together are sufficient to switch a magnetic state of the element when applied to the element in a predetermined arrangement. Also in such methods, the magnetoresistive memory element is disposed between the first and second write lines in an intersecting region located where the first and second write lines would intersect if located on the same plane.

BRIEF DESCRIPTION OF THE DRAWINGS

For a more complete understanding of the principles disclosure herein, and the advantages thereof, reference is now made to the following descriptions taken in conjunction with the accompanying drawings, in which.

DETAILED DESCRIPTION

Figure 1:
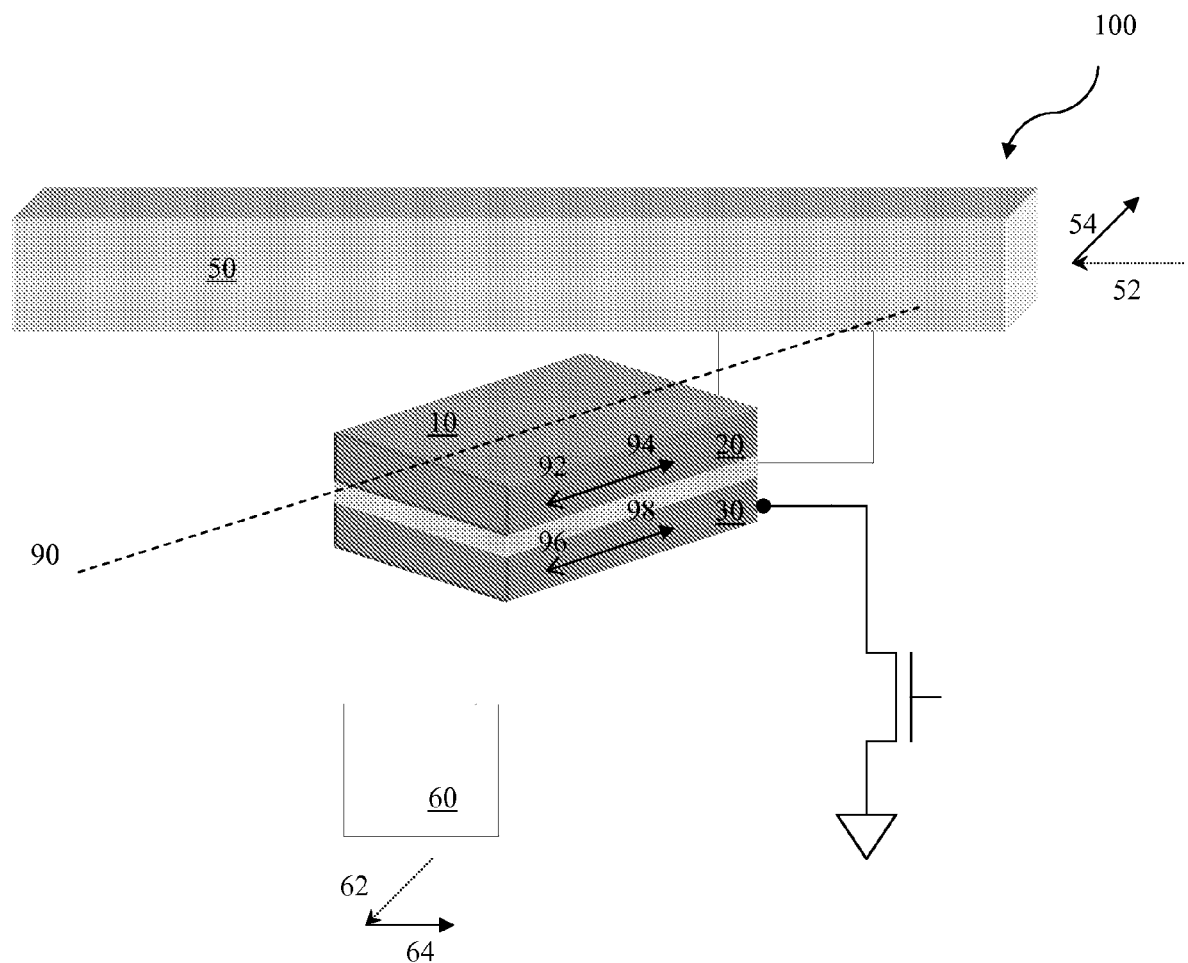
FIG. 1 illustrates a perspective schematic view of a conventional simplified toggle-mode MRAM device.

FIG. 1 illustrates a perspective schematic view of a conventional simplified toggle-mode MRAM device 100, which includes a magnetic tunnel junction ("MTJ") stack 10, a first write line 50, and second write line 60. In the embodiment illustrated in FIG. 1, the MTJ stack 10 does not come in contact with the first and second write lines 50 and 60, and is simply positioned between the two write lines 50 and 60. In an alternative embodiment, however, the MTJ stack 10 may be electrically connected to one or both of the first and second write lines 50 and 60. It is also to be appreciated that although the MTJ stack 10 is illustrated in FIG. 1 as having a rectangular shape, it may be constructed in other shapes and dimensions depending on specific design requirements.

Figure 2:
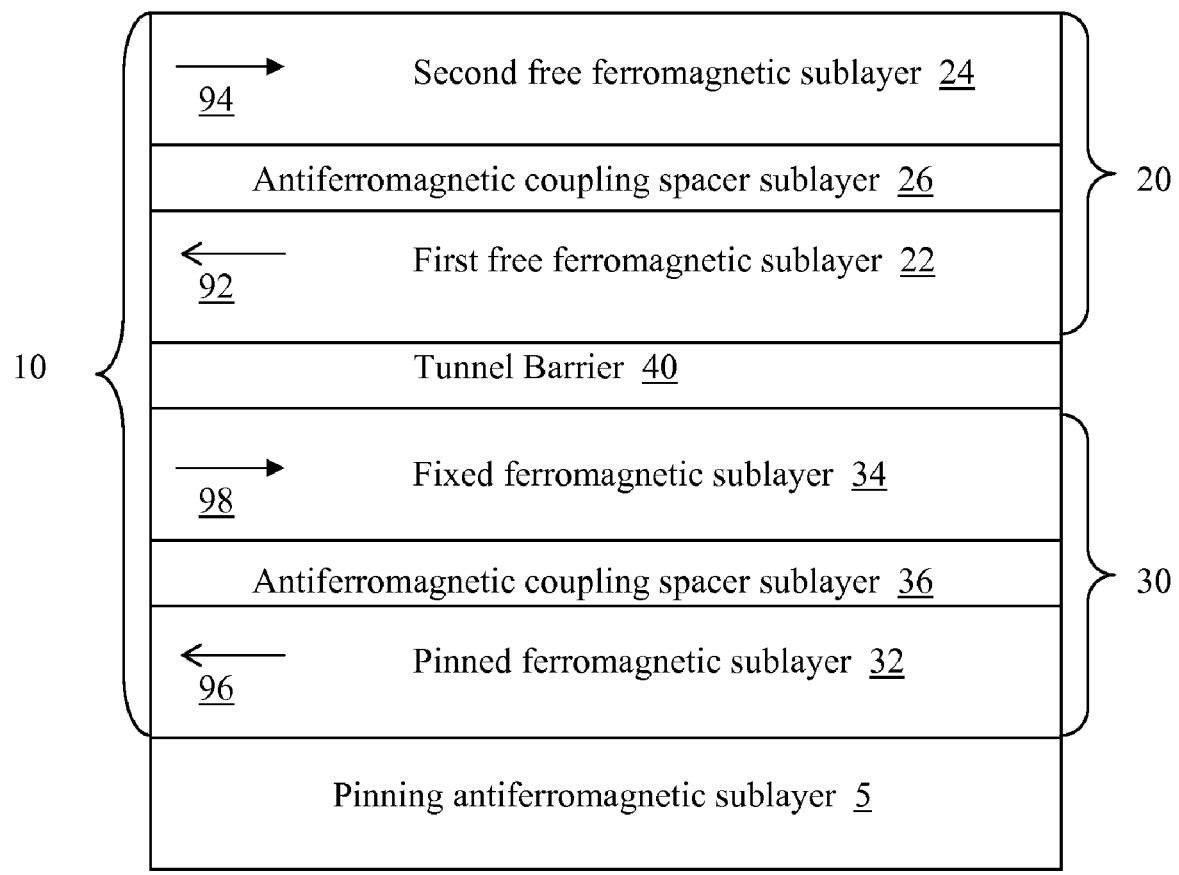
FIG. 2 illustrates a detailed sectional view of the MTJ stack in the MRAM device illustrated in FIG. 1.

FIG. 2 illustrates a detailed schematic view of the MTJ stack 10 in the MRAM device 100 illustrated in FIG. 1. The MTJ stack 10 is the magnetic material in an MRAM device that can be used to store data based on its magnetic moment or direction. The MTJ stack 10 may include three layers, depending on the type of write operation used with the MRAM device 100. In the case of an MRAM device designed for toggle-mode writing ("toggle-mode MRAM device"), the MTJ stack 10 may include a free synthetic antiferromagnetic ("SAF") layer 20, a pinned SAF layer 30, and a tunnel barrier 40.

The free SAF layer 20 may include an antiferromagnetically-coupled structure that further includes a first ferromagnetic sublayer 22, antiferromagnetic coupling spacer sublayer 26, and a second ferromagnetic sublayer 24. The first ferromagnetic sublayer 22 has a magnetic moment vector 92, and the second ferromagnetic sublayer 24 has a magnetic moment vector 94. The antiferromagnetic coupling spacer sublayer 26 eliminates the ferromagnetic coupling between the ferromagnetic sublayers 22 and 24 so that the magnetic moment vectors 92 and 94 can align in an antiparallel orientation. The magnetic moment vectors 92 and 94 may have a resultant vector ("$M_f$ vector") that is preferably relatively small compared to the total magnetization of its magnetic moment vectors. This would allow the free SAF layer 20 to be nearly-balanced.

In the absence of an applied magnetic field, the magnetic anisotropy of a nearly-balanced free SAF layer 20 requires the $M_f$ vector and magnetic moment vectors 92 and 94 to align in a first stable orientation. In the presence of an applied magnetic field, the magnetic moment vectors 92 and 94 of a nearly-balance free SAF layer 20 may respond by rotating to a new orientation that are approximately orthogonal to the applied field. This response contrasts with the response of the magnetization of a single ferromagnetic layer structure or an SAF structure that is not nearly-balanced, in which the $M_f$ vector would simply follow the applied field. In a toggle-mode write operation, magnetic fields of different directions can be generated and manipulated so as to cause the magnetic moment vectors 92 and 94 to rotate 180 degrees. This new orientation is a second stable anisotropy orientation even though the magnetic moment vectors 92 and 94 are antiparallel to their first stable orientation. It is the existence of the first and second stable orientations that allows a toggle-mode MRAM device to have two different memory states. The toggle-mode write operation will later be discussed in greater details.

The antiferromagnetically-coupled structure in the free SAF layer 20 may include ferromagnetic materials such as Ni, Fe, Co, Ru, Cr, CoFe, CoFeB, CoNiFeB, $Gd_{23}Fe_{77}$, $Gd_{24}Fe_{76}$, $Tb_{19}Fe_{81}$, $Tb_{21}Fe_{79}$, $Dy_{17}Fe_{83}$, and $Dy_{21}Fe_{79}$. It is to be appreciated that this is only a representative list of possible materials and that an antiferromagnetically-coupled structure may include other ferromagnetic materials not explicitly mentioned here. It is also to be appreciated that a free SAF layer 20 may include a plurality of the antiferromagnetically coupled structure. For example, an embodiment of the free SAF layer 20 may have N ferromagnetic sublayers separated by N−1 anti-ferromagnetic coupling spacer sublayers, where N is a whole number greater than 2. Such embodiment would increase the switching volume and might be desirable when the size of the MTJ stack 10 decreases. Additionally, a variety of additional structures may be added to the ferromagnetic sublayers in the SAF layer 20 to meet different design needs. For example, a cladding structure may be added to maintain the magnetic state of the ferromagnetic layer. The cladding structure may comprise a soft magnetic material that provides a mechanism for flux closure, thereby preventing the formation of demagnetization fields.

The pinned SAF layer 30, like the free SAF layer 20, may include an antiferromagnetically-coupled structure that includes a pinned ferromagnetic sublayer 32, antiferromagnetic coupling spacer sublayer 36, and a fixed ferromagnetic sublayer 34. The pinned ferromagnetic sublayer 32 has a magnetic moment vector 96, and the fixed ferromagnetic sublayer 34 has a magnetic moment vector 98. The magnetic moment vectors 96 and 98 align in an antiparallel orientation due to the effects of the antiferromagnetic coupling spacer sublayer 36. The magnetic moment vectors 96 and 98 may have a resultant vector ("$M_p$ vector"); but the $M_p$ vector would be fixed due to a pinning antiferromagnetic layer 5, which is externally attached to the pinned SAF layer 30 at the bottom of the MTJ stack 10. Consequently, the $M_p$ vector and magnetic moment vectors 96 and 98 do not rotate in response to an applied field, and the pinned SAF layer 30 does not have to be nearly balanced.

The fixed orientation of the $M_p$ vector is one of the two stable orientations that are determined by the magnetic anisotropy of the pinned SAF layer 30. This fixed orientation can either be parallel or antiparallel with respect to the orientation of an $M_f$ vector that is not influenced by an applied magnetic field.

The antiferromagnetically-coupled structure in the pinned SAF layer 30 may include ferromagnetic materials such as Ni, Fe, Co, Ru, Cr, CoFe, CoFeB, CoNiFeB, $Gd_{23}Fe_{77}$, $Gd_{24}Fe_{76}$, $Tb_{19}Fe_{81}$, $Tb_{21}Fe_{79}$, $Dy_{17}Fe_{83}$, and $Dy_{21}Fe_{79}$. It is to be appreciated that this is only a representative list of possible materials and that an antiferromagnetically-coupled structure may include other ferromagnetic materials not explicitly mentioned here. In addition, there may also be more than one antiferromagnetically-coupled structure, such as NiFe+CoB and other applicable combinations.

The tunnel barrier 40 is sandwiched between the free and pinned SAF layers 20 and 30. The materials for the tunnel barrier 40 may include electrically insulating materials that form a tunneling junction. An example of such materials is aluminum oxide, or even MgO, AlN, TaN, $Ta_2O_5$. Electrons tunnel across the tunnel barrier 40 to provide the magnetoresistance that is sensitive to the orientation of magnetic moment vectors in the free SAF layer 20. The magnetoresistance of the MTJ stack 10 is higher when the magnetic moment vectors 92 and 94 are in one particular stable orientation and is lower when they are switched to the other stable orientation. By measuring the magnetoresistance of the MTJ stack 10 using conventional techniques, one can determine the memory state of a toggle-mode MRAM device.

The orientation of the magnetization of the MTJ stack 10 is indicated in FIG. 1 by the easy axis 90. Easy axis 90 is a magnetic anisotropy axis that is in-line with the stable orientations of the magnetic moment vectors 96 and 98. Absent an applied magnetic field, the easy axis 90 is also in-line with the stable orientations of the magnetic moment vectors 92 and 94 in the free SAF layer 20. In the presence of an applied magnetic field, such as magnetic fields 54 or 64, the magnetic moment vectors 92 and 94 may rotate away from the easy axis 90; but once the applied magnetic field is removed, the magnetic moment vectors 92 and 94 would again align along the easy axis 90, either in parallel or antiparallel orientation to their original alignment. As discussed previously, each of the magnetic moment vectors 96 and 98 in the pinned SAF layer 30 are fixed in one stable orientation so that they do not change their orientation with respect to the easy axis 90 even in the presence of an applied magnetic field.

The toggle write lines 50 and 60 illustrated in FIG. 1 are electrical conductors that are capable of producing magnetic fields when currents pass through them. When a current 52 passes through the first write line 50 in the direction illustrated in FIG. 1, a magnetic field 54 is produced. Similarly, when a current 62 passes through the second write line 60 in the direction illustrated in FIG. 1, a magnetic field 64 is produced. The magnetic fields 54 and 64 are orthogonal to currents 52 and 62, respectively, and the "Right-hand Rule" used in physics determines the direction of the magnetic fields 54 and 64 on a plane of the MTJ stack 10 extending parallel with the lengths of the first and second write lines 50 and 60 (i.e., in the X and Y directions). On this plane of the MTJ stack 10, example directions for magnetic fields 54 and 64 are illustrated in FIG. 1.

To produce an applied field that can switch the memory states of a toggle-mode MRAM device, conventional techniques employ the architectural arrangement illustrated in FIG. 1. In the illustrated architecture, the first and second write lines 50 and 60 are parallel to the two-dimensional plane mentioned above. Further, the MTJ stack 10 is disposed between the first and second write lines 50 and 60 at an intersecting region of the first and second write lines 50 and 60. As used herein, the term "intersecting region" refers to the proximate region in three-dimensional space where the first and second write lines 50 and 60 overlap and would intersect if the write lines were formed on the same plane extending in the X-Y directions. In this three-dimensional region, the overlapping first and second write lines 50 and 60 can be orthogonally projected onto a two-dimensional plane that is parallel to the lengths of both write lines 50, 60, and extending in the X-Y directions, so that their "orthogonal projections" are intersecting even though the actual write lines 50, 60 do not actually intersect.

Figure 3:
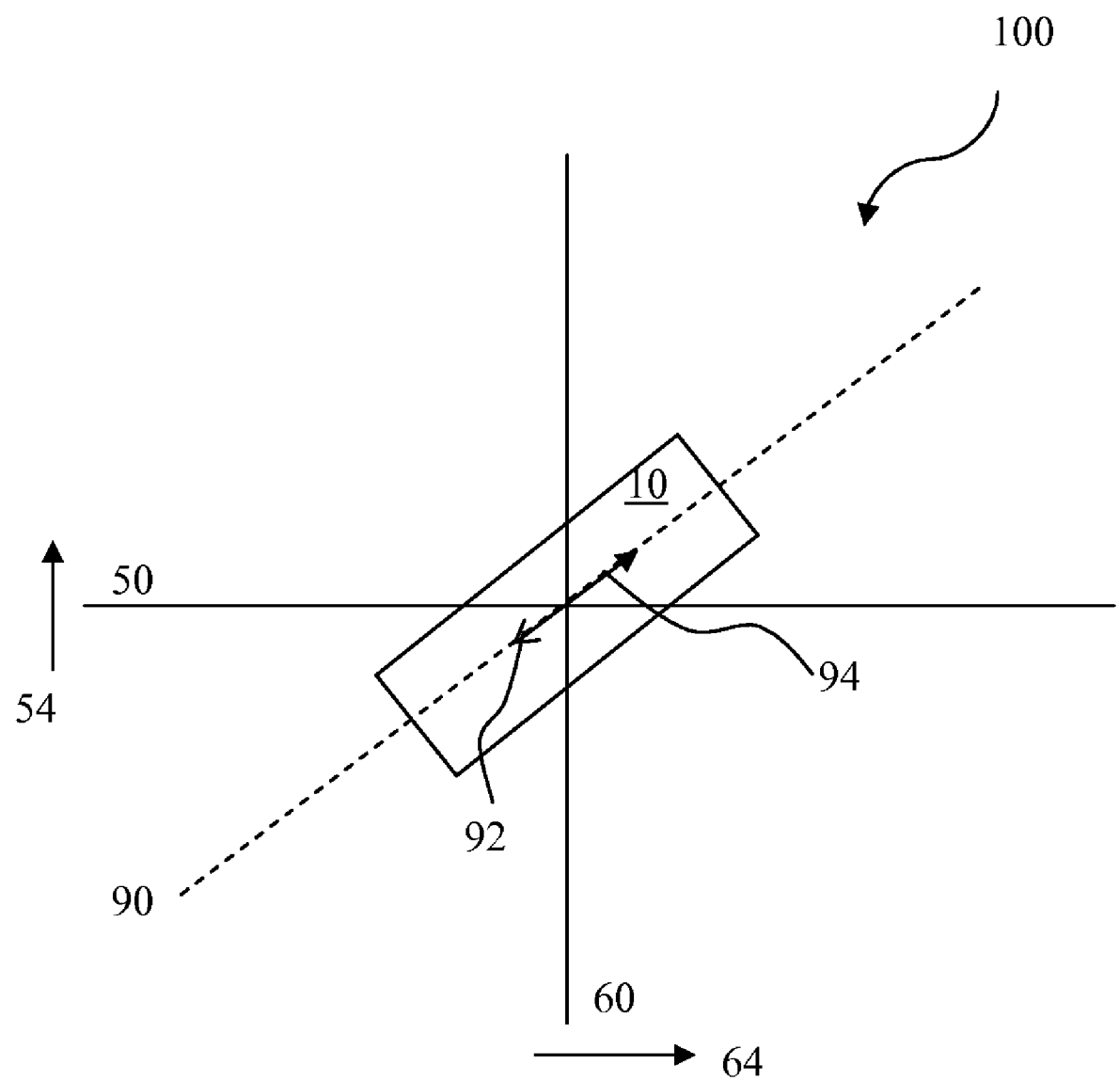
FIG. 3 illustrates a plan view of the conventional toggle-mode MRAM device shown in FIG. 1.

An orthogonal projection is known by a person of ordinary skill in art as the two-dimensional graphic representation of an object formed by the perpendicular intersections of lines drawn from points on the object to a plane of projection. Such orthogonal projections of the first and second write lines 50 and 60 may be illustrated by the plan view of the conventional toggle-mode MRAM device 100 shown in FIG. 3. In FIG. 3, the conventional architecture in FIG. 1 is shown two-dimensionally by the orthogonal projections of the write lines 50, 60 on a two-dimensional plane that is parallel to both write lines 50, 60, and by the orthogonal projection of the easy axis 90 on the same plane. Thus, the solid lines represent the orthogonal projections of the first write line 50 and second write line 60, and the dashed line represents the orthogonal projection of the easy axis 90. To simplify the discussion from hereon, unless otherwise noted, a reference to the orientation of the first and second write lines 50 and 60 relative to each other or to the easy axis 90 in this disclosure should be understood as a reference to the orientations of their orthogonal projections.

In the architecture shown in FIG. 3, the first and second write lines are oriented at a 90° angle with respect to each other. The MTJ stack 10 and the freely rotating magnetic moment vectors 92 and 94 are positioned in-line with the easy axis 90, which passes through the intersection of the orthogonal write lines and orients at a 45° angle with respect to either of the first and second write lines 50 and 60.

In this architecture, current 52 generates magnetic field 54 in the direction depicted in FIG. 3 when it is conducted through the first write line 50. Similarly, when conducted through the second write line 60, current 62 generates the magnetic field 64 in the direction depicted in FIG. 3. The magnetic fields 54 and 64 can switch the magnetic moment vectors 92 and 94 between their first and second stable orientations if they are applied in proper sequence, in accordance with typical toggle-mode switching techniques.

Figure 4:
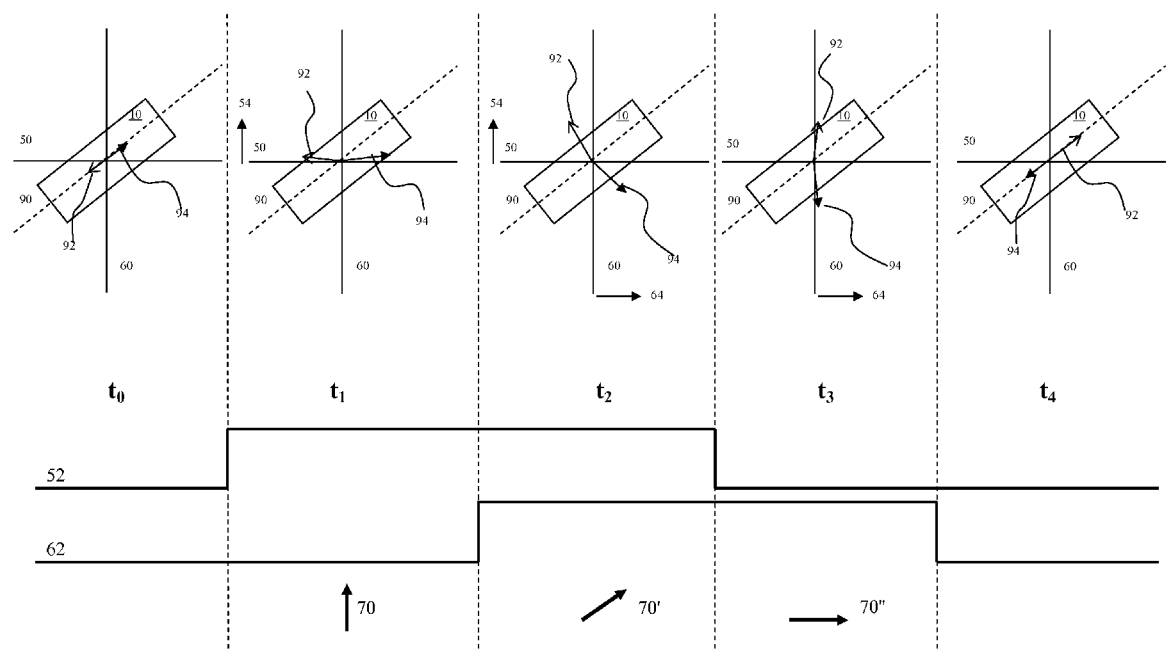
FIG. 4 illustrates a toggle-mode write operation for switching magnetic moment vectors between their first and second stable orientations in conventional toggle-mode MRAM devices.

A toggle-mode write operation for switching magnetic moment vectors 92 and 94 between their first and second stable orientations is illustrated in FIG. 4. The illustrated write operation includes applying a pulse current 52 through the first write line 50 and a delayed pulse current 62 through the second write line 60. At the junction of the first and second write lines 50 and 60, the two pulse currents 52 and 62 together produce a rotating magnetic field over sequential periods of time ($t_0$-$t_4$). In response to such an applied field, the magnetic moment vectors 92 and 94 in the free SAF layer 20 would rotate by 180° and switch from a first stable orientation to a second stable orientation. It is to be appreciated that the toggle-mode write operation ensures that the magnetic moment vectors 92 and 94 would switch from one stable orientation to another, regardless of which particular magnetoresistive state (high or low) corresponds to the first stable orientation. As a result, the first and second write lines 50 and 60 do not have to have the capability of conducting currents in more than one direction.

FIG. 4 also shows the orientations of the applied field and the magnetic moment vectors 92 and 94 during the different time periods. Before the write operation begins ("$t_0$ period"), the pulse currents 52 and 62 have not been applied and there is no applied field. Consequently, the magnetic moment vectors 92 and 94 remain aligned in their first stable orientation along the easy axis 90.

During the first time period of the write operation ("$t_1$ period"), pulse current 52 is applied and it produces a magnetic field 54, which solely constitutes the applied field in this time period. The orientation of the applied magnetic field is represented by orientation 70 in the $t_1$ period of FIG. 4. Orientation 70 is identical to the orientation of the magnetic field 54 and it forms a 45° angle with respect to the easy axis 90. In response to the applied field, the magnetic moment vectors 92 and 94, while substantially maintaining their antiparallel orientation, rotate away from the easy axis 90 to be approximately orthogonal to orientation 70 of the applied field. It is noted that in the illustrated embodiments, vectors 92 and 94 may be seen as becoming a bit less anti-parallel to each other for period t0 to period t1. This may be caused by less coupling in the free SAF layer (92 and 94). If this coupling is large enough, however, they will keep their complete anti-parallel orientation. The new orientation of the magnetic moment vectors 92 and 94 is shown in the $t_1$ period of FIG. 4. Although this new orientation of the magnetic moment vectors 92 and 94 reduces the total magnetic energy in an applied magnetic field, it is not in a stable energy state. If the applied field is removed during the $t_1$ period, the magnetic moment vectors 92 and 94 would return to their first stable orientation in-line with the easy axis 90.

During the second time period of the write operation ("$t_2$ period"), pulse current 62 is applied while pulse current 52 is maintained, as shown in the timing diagram included in FIG. 4. They generate magnetic fields 64 and 54 at the same time, respectively, which combine to form the applied magnetic field with orientation 70' as shown in the $t_2$ period of FIG. 4. Orientation 70' is in-line with the easy axis 90 and forms a 45° angle with respect to original orientation 70. As illustrated, the applied field has rotated clockwise from orientation 70 to orientation 70', and this causes the magnetic moment vectors 92 and 94 to also rotate clockwise in order to maintain their orthogonal orientation with respect to the orientation of the applied magnetic field 70'.

During the third time period of the write operation ("$t_3$ period"), pulse current 52 is turned off while pulse current 62 is maintained, also as shown in the timing diagram. Consequently, the magnetic field 54 is removed and the magnetic field 64 is left to solely constitute the applied field with a new orientation 70". Orientation 70" forms a 90° angle with respect to orientation 70 on the other side of the easy axis 90. As the applied field further rotates clockwise from orientation 70' to orientation 70", the magnetic moment vectors 92 and 94 respond by also rotating clockwise to the orientation illustrated in the $t_3$ period of FIG. 4. In the illustrated orientation during this time period, the magnetic moment vectors 92 and 94 are close enough to their second stable orientation (i.e., each anti-parallel to their first stable orientation shown in the $t_0$ period) that they are not likely to return to their first stable orientation if the applied field is removed. Instead, the magnetic moment vectors 92 and 94 are likely to continue to rotate clockwise to their second stable orientation.

Thus, to finish the write operation, pulse current 62 is turned off and the magnetic field 64, which remained as the only applied field in the $t_3$ period, is removed during the fourth time period ("$t_4$ period"). By the end of the $t_4$ period, the magnetic moment vectors 92 and 94 would have rotated 180° as illustrated in FIG. 4, and this corresponds to a switch in the memory state of the toggle-mode MRAM device 100. Therefore, the term "switching field" has been used to describe a rotating magnetic field whose magnitude is large enough to switch the magnetic moment vectors 92 and 94 from a first stable orientation to a second stable orientation by rotating them 180°.

It is desirable to reduce the magnitude of the toggle-mode switching field because such reduction would decrease the required energy to generate the switching field and lower the power consumption of a toggle-mode MRAM device. One way to accomplish this is the conventional approach of introducing a bias field that orients along the easy axis 90 and acts on the magnetic moment vectors 92 and 94. Conveniently, such a bias field may be generated without any addition to the MTJ stack 10. The pinned SAF layer 30, as discussed previously, has an $M_p$ vector, and the magnitude of the $M_p$ vector may be adjusted so as to generate a magnetic fringing field that aligns along the easy axis 90 and acts as a bias field within the free SAF layer 20. Some of the possible adjustments include varying the shape and dimension of the MTJ stack 10, or altering the composition of the pinned SAF layer 30.

Figure 5:
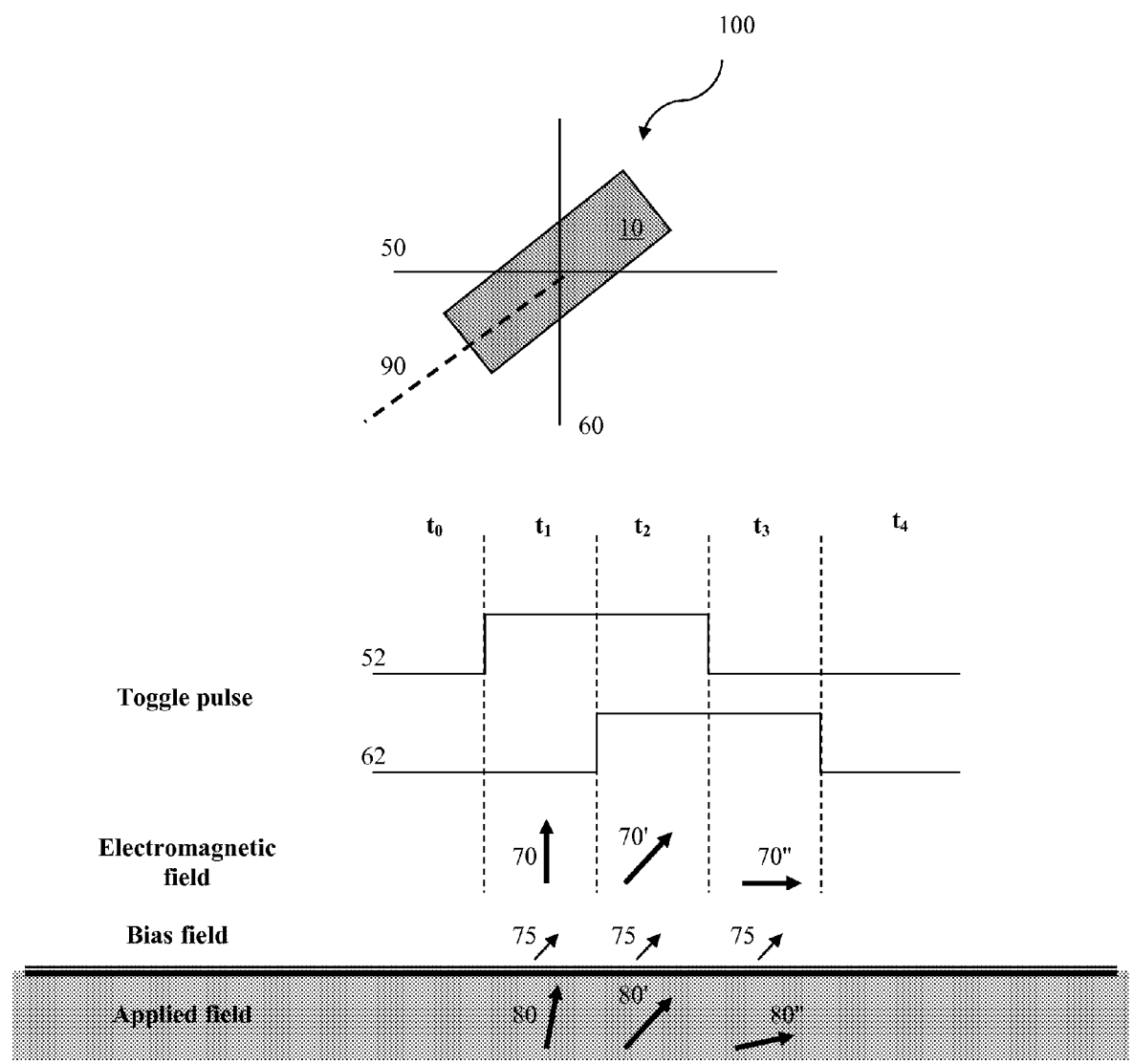
FIG. 5 illustrates the net applied magnetic fields on the conventional MRAM device of FIG. 1 based on the effect of a bias field introduced along the easy axis.

Although a bias field can reduce the switching field, it can unfortunately also interfere with the applied field during the write operation. As discussed previously, a bias field would be introduced along the easy axis 90 and its orientation is illustrated by orientation 75 in FIG. 5. This bias field, however, may interfere with the rotating applied field generated by a conventional toggle-mode MRAM device and cause the applied field to rotate from orientations 70, 70', and 70" to orientations 80, 80', and 80", respectively. During the $t_1$ period, the bias field in orientation 75 would combine with the magnetic field 54 in orientation 70 and rotate the applied field clockwise to orientation 80, rather than the desired orientation 70. Likewise, during the $t_3$ period, the bias field in orientation 75 would combine with the magnetic field in orientation 70" and rotate the applied field counterclockwise to orientation 80", rather than the desired orientation 70". During the $t_2$ period, the bias field would combine with the magnetic field generated by the pulse currents 52 and 62 passing though the orthogonal write lines 50 and 60 and would rotate the applied field to a new orientation 80'. If the magnitude of the pulse currents 52 and 62 are substantially similar, the new orientation 80' of the applied field may be similar to its bias-free orientation 70' as shown in FIG. 5. For the embodiments discussed in this disclosure, the pulse currents 52 and 62 are assumed to have the same magnitude, and thus orientations 70' and 80' are assumed to be substantially similar. But it is to be appreciated that the magnitudes of pulse currents 52 and 62 may be different in other embodiments. For example, despite resulting in greater power consumption, the magnitude of pulse current 62 may be adjusted to be higher than that of pulse current 52.

As seen from the above, the interference on the intended magnetic field(s) caused by the bias field can result in a net applied field that can adversely affect the toggle-mode write operation, which may result in writing errors. As the bias field causes the applied field to rotate counterclockwise to orientation 80" in the $t_3$ period, the corresponding magnetic moment vectors 92 and 94 do not fully rotate clockwise to reach their second stable orientation. Rather, they remain in more unstable orientations that correspond to higher energy states. This in turn increases the probability of the magnetic moment vectors 92 and 94 reverting to their first stable orientation rather than switching to their second stable orientations when the applied field is removed. A similar problem may also occur in the clockwise direction during the $t_1$ period. Therefore, during certain time periods, the probability of writing errors increases as the orientation of the applied field increasingly rotates away from the desired orientations 70 and 70".

Figure 6:
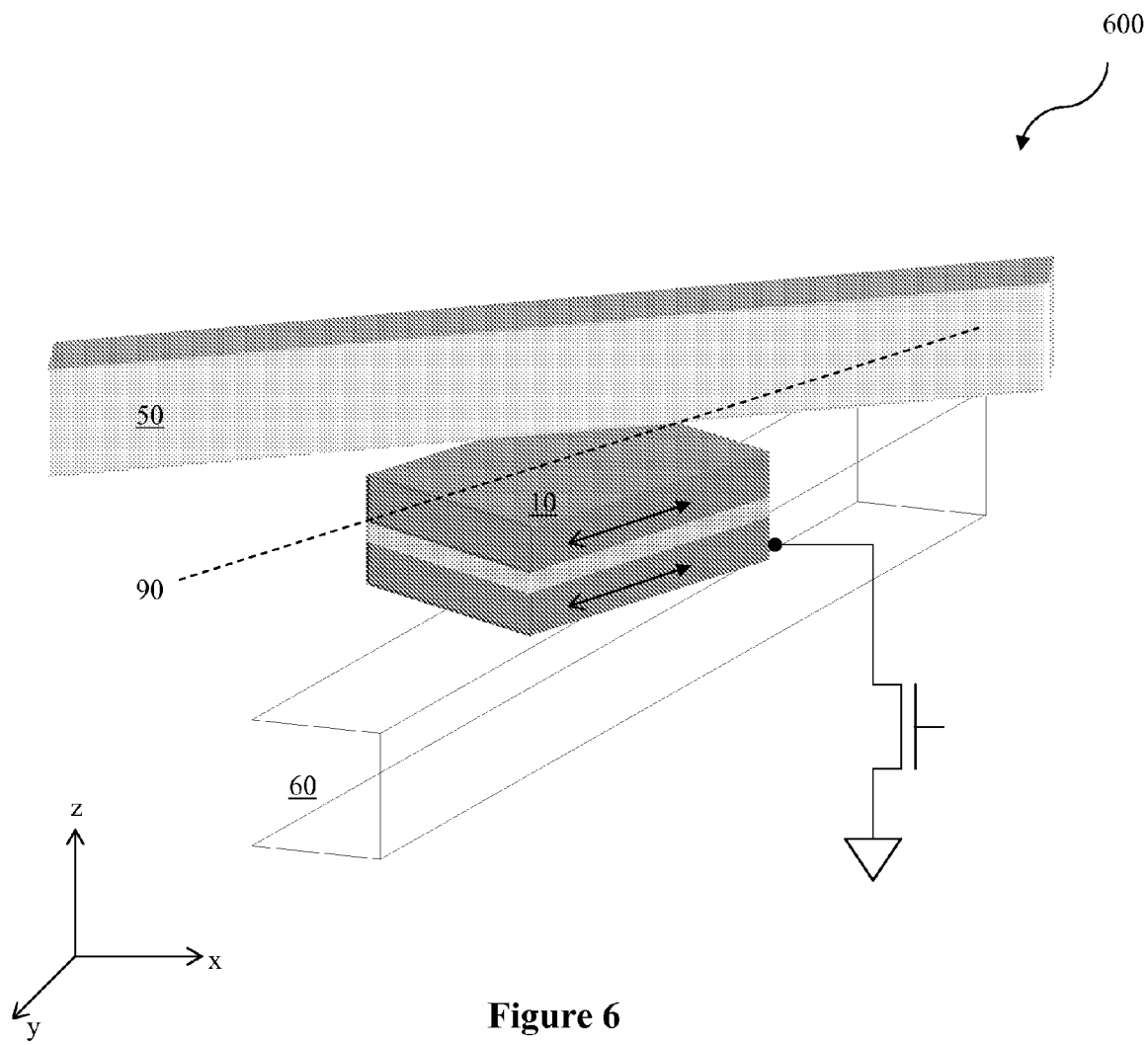
FIG. 6 illustrates a perspective view of one embodiment of an MRAM device constructed according to the principles disclosed herein.

The disclosed principles herein are based on the recognition that the adverse effects of a bias field may be reduced if the applied field can be corrected back to its bias-free desirable orientations 70, 70', and 70". FIG. 6 illustrates a perspective view of one embodiment of an MRAM device 600 constructed according to the principles disclosed herein, that corrects the orientation of the applied field with small-angle-toggle-write-lines ("SATWL"). In this embodiment, some of architecture of the SATWL MRAM device 600, as shown in X-Y-Z space, is similar to that of the conventional MRAM device 100 shown in FIG. 1. More specifically, the MTJ stack 10 for a SATWL MRAM device 600 may be constructed using the same materials and structure as those disclosed for a conventional toggle-mode MRAM device 100. Moreover, its pinned SAF layer 30 may generate a bias field within the free SAF layer 20, as discussed above.

In accordance with the disclosed principles, however, the novel MRAM device 600 shown in FIG. 6 provides a unique orientation of the first and second writing lines 50 and 60 relative to each other. Rather than being orthogonal to each other along their lengths in the X-Y plane, as found in conventional toggle-mode MRAM devices, the first and second write lines 50 and 60 are not orthogonal and actually create two acute angles along their lengths in this X-Y plane. In the Z-X or Z-Y plane, however, the first and second write lines 50, 60 may be parallel as depicted in FIG. 6, or may otherwise be non-parallel in an alternative embodiment.

Figure 7:
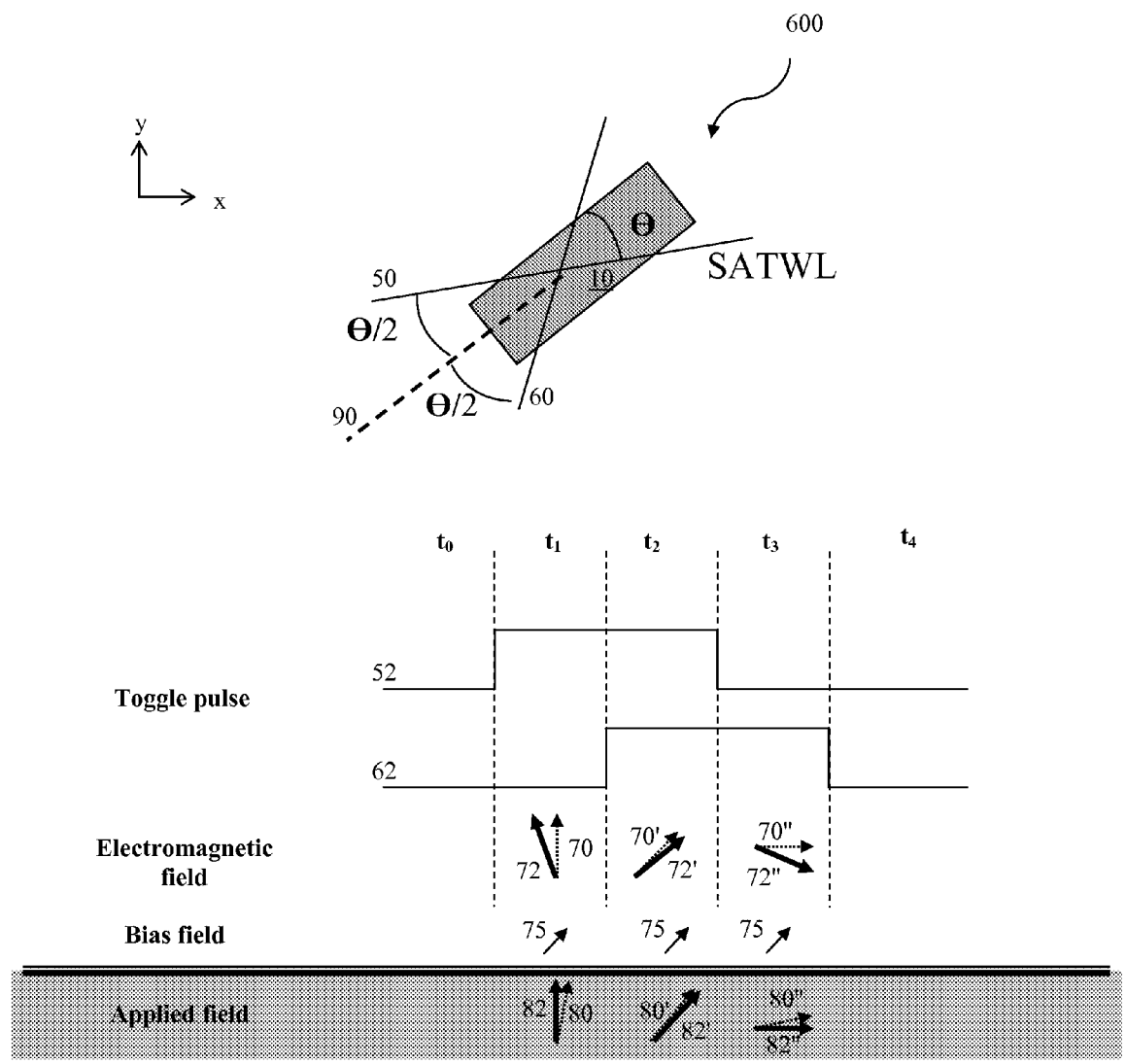
FIG. 7 shows a top view of the MRAM device in FIG. 6, as well as the net applied magnetic fields on this novel MRAM device once the affects of the bias field have been compensated for according to the disclosed principles.

FIG. 7 shows a top view of the SATWL MRAM device 600 constructed as disclosed herein. In the illustrated embodiment, the first write line 50 has rotated clockwise on the X-Y plane, while the second write line 60 has rotated counterclockwise on this plane so that the angles between a projected intersection of these lines 50, 60 are not 90°. The non-orthogonal angles between the write lines may be formed differently other embodiments, For example, the first write line 50 may remain in the original position found in conventional devices, while the second write line 60 rotates counterclockwise, or vice versa. It should further be appreciated that the first and second writes line 50 and 60 are interchangeable, and as a result, the orientation of the disclosed SATWL MRAM architecture may be modified according to the principles discussed in this disclosure. For example, the first write line 50 may rotate counterclockwise while the second write line 60 rotates clockwise to create non-orthogonal angles.

Due to the non-orthogonal alignment along their lengths on the X-Y plane, the first and second write lines 50 and 60 form two identical acute angles, and their angle measurement with respect to each other is represented by θ. The first and second write lines 50 and 60 also form two identical obtuse angles, whose angle measurement can be represented by the expression 180°−θ.

As illustrated in FIG. 7, the MTJ stack 10 may be oriented in such a way that the easy axis 90 passes through the acute angles formed by the write lines 50, 60, and creates two identical angles whose angle measurements are both θ/2. In the embodiments disclosed herein, the easy axis 90 is assumed to have the same orientation illustrated in FIG. 7. It is to be appreciated, however, that in other embodiments, the easy axis 90 may be oriented so that it forms a first angle with the first write line 50 and a different second angle with the second write line 60. This orientation of the easy axis 90 may be desirable when the pulse currents 52 and 62 have different magnitudes and generate magnetic fields of different magnitudes.

As illustrated in FIG. 7, the non-orthogonal architecture of the SATWL MRAM device 600 alters the orientations of the magnetic fields produced by pulse currents 52 and 62. The new orientations of the magnetic fields 54 and 64, in turn, correct the orientations of the applied field at the intersecting region of the first and second write lines 50 and 60. A pulse current 52 passing through the first write line 50 of a SATWL architecture would now generate a magnetic field 54 in orientation 72 instead of orientation 70; orientation 72 represents a counterclockwise rotation from orientation 70. A pulse current 62 passing through the second write line 60 would similarly generate a magnetic field 64 in a new orientation 72" instead of orientation 70". Unlike orientation 72, however, orientation 72" represents a clockwise rotation from orientation 70".

During the toggle-mode write operation, the new orientations 72, 72" of the magnetic fields 54 and 64 may compensate for the interference generated by the bias field. During the $t_1$ period illustrated in FIG. 7, the magnetic field 54 in orientation 72 may counteract the clockwise pull of the bias field (orientation 75), thus correcting the net applied field on the device 600 from orientation 80 to orientation 82. Also, the magnetic field 64 in orientation 72" may similarly counteract the counterclockwise pull of the bias field during the $t_3$ period, and this counteraction would correct the net applied field on the device 600 from orientation 80" to 82".

It is desirable for the corrected orientations 82 and 82" to be substantially similar to the bias-free orientations 70 and 70". Whether this extent of correction can be achieved depends on the choice of θ, which is the angle measurement between the non-orthogonal first and second write lines 50 and 60 disclosed herein. To illustrate the choice of a desired θ, the X-Y space illustrated in FIG. 7 is first defined. The X-direction is defined by an axis that is orthogonal to the bias-free orientation 70 of the applied field so that it has no vector-component in the X-direction. The Y-direction, on the other hand, is defined by an axis that is orthogonal to the bias-free orientation 70" of the applied field so that it has no vector-component in the Y-direction. In this X-Y space, the X- and Y-axes are orthogonal and the easy axis 90 forms a 45° angle with each axis.

For orientation 82 to be substantially similar to orientation 70, θ is chosen so that the corrected applied field in orientation 82 has nearly-balanced X-component vectors, i.e., the X-components of the bias field in orientation 75 and magnetic field 54 in orientation 72 are nearly balanced. In X-Y space, the X-component vector of the bias field in orientation 75 may be expressed as:

$$B_{bias} \cos 45°,$$

wherein $B_{bias}$ is the magnitude of the bias field. The X-component vector of the magnetic field 54 in orientation 72 may be expressed as:

$$B_{54} \sin(45°-\theta/2)$$

wherein $B_{54}$ is the magnitude of the magnetic field 54. Accordingly, a desired θ would be one that satisfies equation (1):

$$B_{bias} \cos 45° = B_{54} \sin(45° - \theta/2) \quad (1).$$

Similarly, for orientation 82″ to be substantially similar to orientation 70″, θ is chosen such that the corrected applied field in orientation 82″ has nearly-balanced Y-component vectors in the X-Y space. The Y-component vector of the bias field in orientation 75 may be expressed as:

$$B_{bias} \sin 45°,$$

and the Y-component vector of the magnetic field 64 in orientation 72″ may be expressed as:

$$B_{64} \sin(45° - \theta/2),$$

wherein $B_{64}$ is the magnitude of the magnetic field 64. Accordingly, a desired θ would be one that satisfies equation (2):

$$B_{bias} \sin 45° = B_{64} \sin(45° - \theta/2) \quad (2).$$

Although there are two governing equations for choosing θ, it may be possible to choose one θ that would allow both corrected orientations 82′ and 82″ to be substantially similar to the bias-free orientations 70′ and 70″. In an embodiment in which the pulse currents 52 and 62 have the same magnitude, $B_{54}$ and $B_{64}$ would have the same value as well. This, consequently, reduces the right side of both equations to the expression:

$$B \sin(45° - \theta/2),$$

wherein B would be the value of both $B_{54}$ and $B_{64}$. Furthermore, the left side of both equations may be reduced to the expression:

$$0.707 B_{bias},$$

because sin 45° and cos 45° are both equal to the numeric value of 0.5. Thus, one may choose θ based on the resulting equation (3):

$$0.707 B_{bias} = B \sin(45° - \theta/2) \quad (3).$$

In this case, θ may have values greater zero but less than 90, depending on the magnitudes of the bias and magnetic fields. Of course, in embodiments where the applied currents 52, 62 are not equal, the individual equations may be employed.

In an embodiment in which the pulse currents 52 and 62 have different magnitudes, the choice of a desired θ may be guided by a preference for orientation 82″ to be substantially similar to orientation 70″ during the $t_3$ period. This preference is based on the premise that interferences from the bias field during other time periods do not have significant impact on the probability of writing errors. It is the energy state and the stability of the magnetic moment vectors 92 and 94 right before the applied field is removed that mainly determines the probability of writing errors. In an alternative embodiment, however, different design considerations may compel the use of other guiding preferences.

Figure 8:
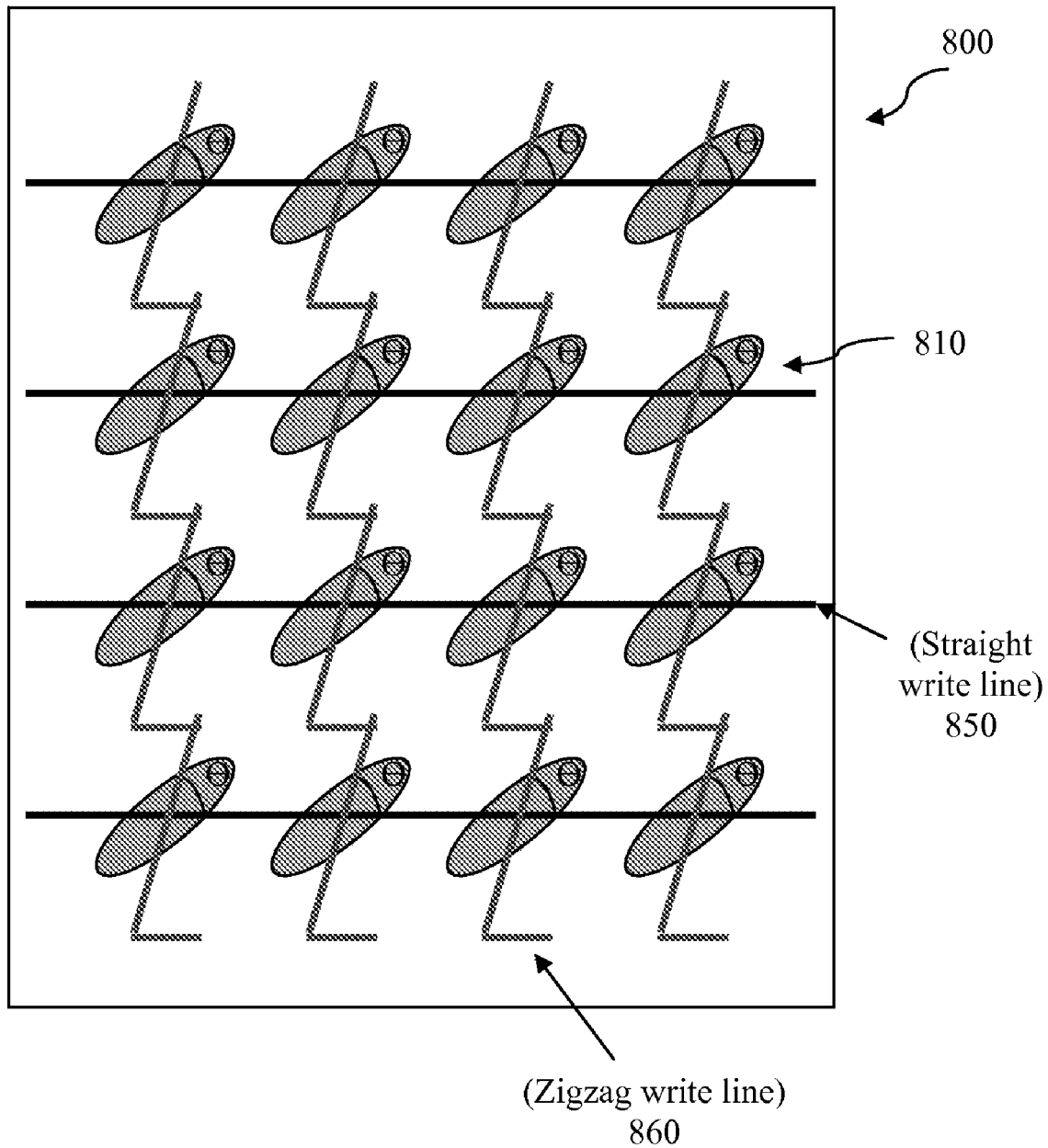
FIG. 8 illustrates a partial schematic view of one embodiment of a memory array comprising SATWL MRAM devices according to the disclosed principles.

FIG. 8 illustrates a partial schematic view of a memory array 800 comprising SATWL MRAM devices (one of which is labeled 810) and constructed according to the disclosed principles. In this embodiment, each MTJ stack within each device 810 is shown to have an elliptical shape instead of the rectangular shape that has been shown in the previous embodiments. Having a different shape, however, does not change how each MTJ stack orients between the write lines.

As in the previous embodiments, the easy axis of each MTJ stack still passes through the acute angles formed by the non-orthogonal write lines.

In the embodiment illustrated in FIG. 8, the devices 810 are aligned in horizontal rows and vertical columns. To create this grid-like array 800, a set of straight write lines (one of which is labeled 850) may be used together with a set of zigzagged or staggered write lines (one of which is labeled 860). Along one dimension of the array 800, either horizontally or vertically, the first set of write lines 850 are straight and parallel, and may keep the devices 810 aligned accordingly. In the other dimension of the array 800, however, the second set of write lines 860 is zigzagged in order to keep the devices 810 aligned in parallel straight rows/columns. This is because the two sets of write lines are not orthogonally aligned at the intersecting region of each MTJ stack 810, in accordance with the principles of this disclosure. Therefore, as shown in FIG. 8, each vertical write line 860 "zigzags" between each device 810 after it crosses each horizontal straight write line 850 at angle θ so that it does not cross into an adjacent column and so the devices 810 in a single column are maintained in substantially straight alignment. In other embodiments, the straight write lines 850 may be oriented vertically and the zigzagged write lines 860 may be oriented horizontally.

Figure 9:
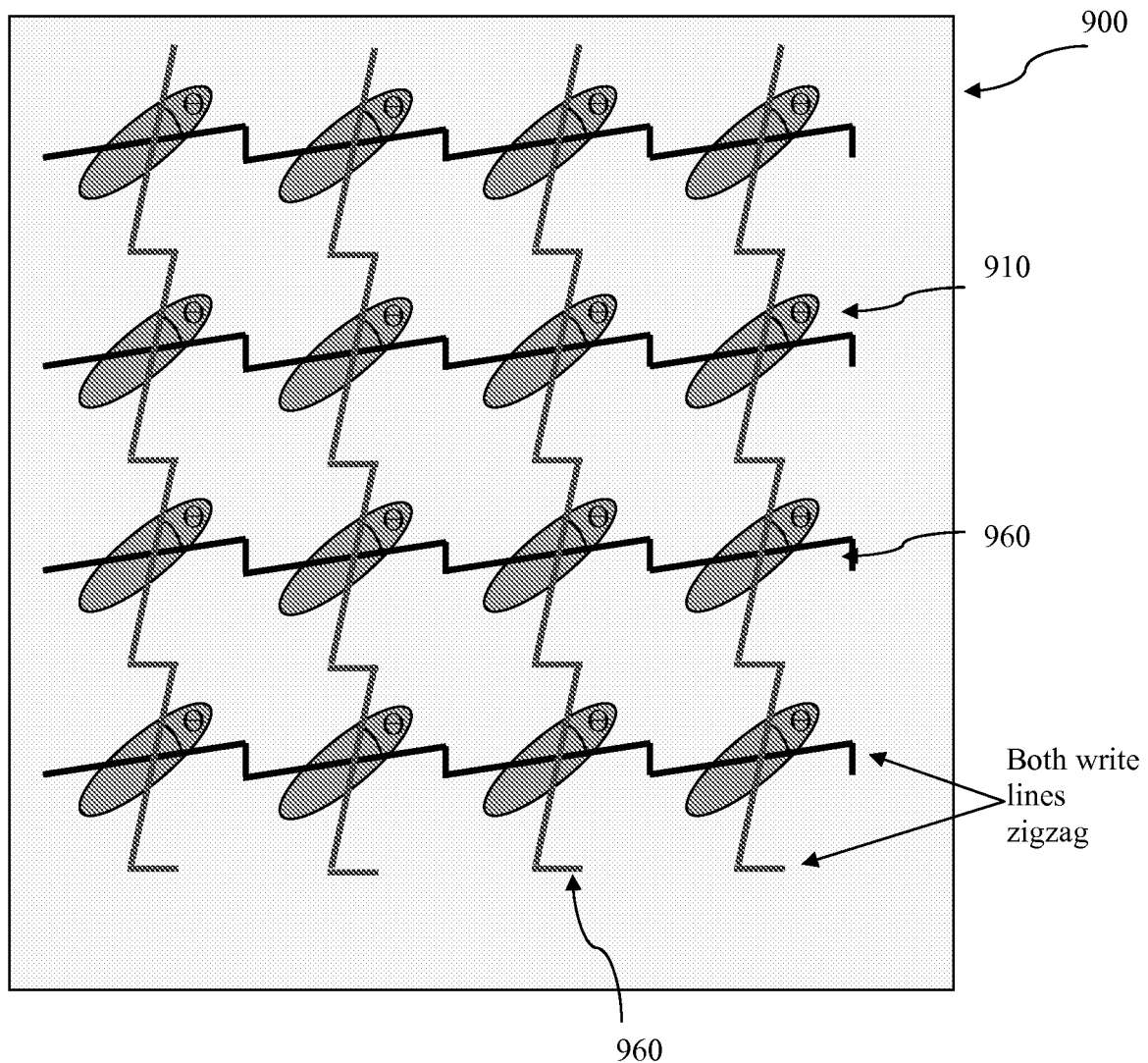
FIG. 9 illustrates another embodiment of a memory array comprising SATWL MRAM devices according to the disclosed principles.

FIG. 9 illustrates another embodiment of a grid-like memory array 900 that comprises SATWL MRAM devices (on of which is labeled 910) aligned in horizontal rows and vertical columns. In this embodiment, two sets of zigzagged write lines (one of each of which are labeled 950 and 960, respectively) are used to create the array 900. A first set of write lines 950 would zigzag along one dimension of the array 900, while a second set of write lines 960 would zigzag along the other dimension of the array 900. A device 910 would lie in each intersecting region of the first and second sets of write lines 950, 960, where the write lines 950, 960 cross each other (their projected orientation) at angle θ. The locations of where the write lines 950, 960 zigzag are spaced evenly in both dimensions of the array 900 so that the devices 910 may align in straight vertical columns and straight horizontal rows. Furthermore, in embodiments where neither write line 50, 60 is zigzagged, the non-orthogonal sets of write lines 50, 60 would not result in an array of devices aligned in straight vertical columns and rows, but instead aligned along the non-orthogonal write lines 50, 60.

Figure 10:
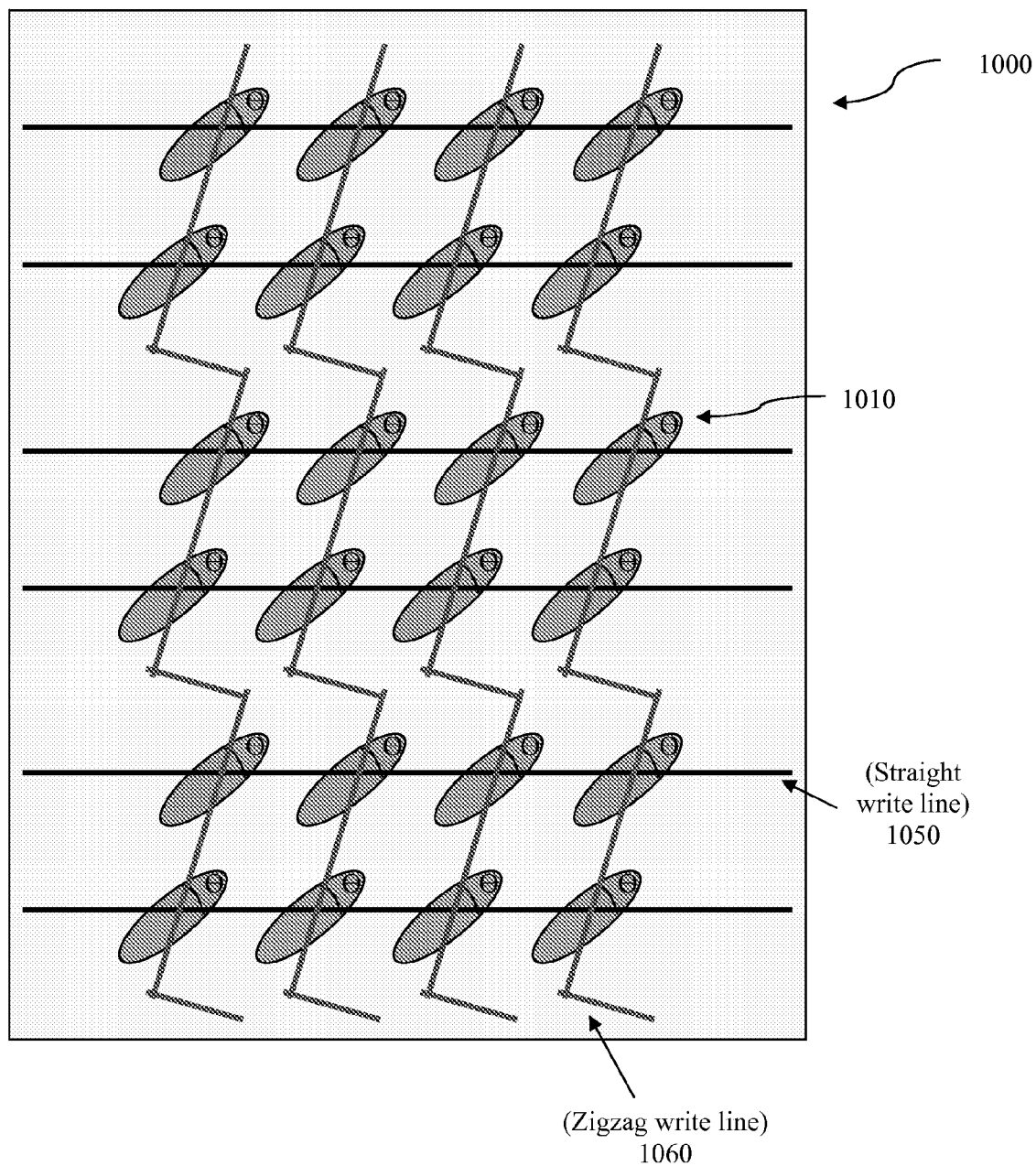
FIG. 10 illustrates yet another embodiment of a memory array according to the discloses principles that provides a high density of SATWL MRAM devices.

In addition to arrays 800, 900 shown in FIGS. 8 and 9, the disclosed novel SATWL MRAM devices may be arranged in other types of arrays, in accordance with desired designs. For example, FIG. 10 illustrates a memory array 1000 with a higher density of SATWL MRAM devices (one of which is labeled 1010) than seen in FIGS. 8 and 9. In this embodiment, the devices 1010 are aligned along a set of parallel straight write lines (one of which is labeled 1050) in one dimension, and along a set of zigzagged write lines (one of which is labeled 1060) in the other dimension. In contrast to the embodiment illustrated in FIG. 8, the zigzagging write lines 1060 do not zigzag after passing through the intersecting region at each straight write line 1050 (i.e., each row of devices 1010); rather, they zigzag after passing through the intersecting region at every two straight write lines 1050. Aligned in this manner, the straight write lines 1050 may be packed closer together to create a memory array 1000 with a higher density of MRAM devices than perhaps provided by other arrangements.

While various embodiments of toggle-mode MRAM devices, having small-angle toggle write lines, according to the principles disclosed herein have been described above, it should be understood that they have been presented by way of example only, and not limitation. Accordingly, the following claims should be construed broadly to cover any embodiment tailored to achieve the principles disclosed herein. Thus, the breadth and scope of the invention(s) should not be limited by any of the above-described exemplary embodiments, but should be defined only in accordance with any claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 C.F.R. 1.77 or otherwise to provide organizational cues. These headings shall not limit or characterize the invention(s) set out in any claims that may issue from this disclosure. Specifically and by way of example, although the headings refer to a "Technical Field," such claims should not be limited by the language chosen under this heading to describe the so-called technical field. Further, a description of a technology in the "Background" is not to be construed as an admission that technology is prior art to any invention(s) in this disclosure. Neither is the "Brief Summary" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:

1. A magnetoresistive random access memory device, comprising:
    a first write line extending along a first direction on a first plane;
    a second write line extending along a second direction on a second plane that is parallel to the first plane, wherein the second direction is non-orthogonal to the first direction;
    a magnetoresistive memory element having a switchable magnetic state and disposed between the first and second write lines in an intersecting region located where the first and second write lines would intersect if located on the same plane; and
    wherein the first write line is configured to provide a first magnetic field (H-Field) to the memory element when carrying a first write current, and the second write line is configured to provide a second H-Field to the memory element when carrying a second write current, the first and second H-Fields together sufficient to switch a magnetic state of the element when applied to the element in a predetermined arrangement, and the first and second H-fields each comprising an orientation of less than 45° with respect to a magnetic anisotropic easy axis of the memory element.

2. A device according to claim 1, wherein the magnetoresistive memory element is a toggle-mode memory element comprising:
    a free synthetic antiferromagnetic (SAF) layer,
    a pinned SAF layer, and
    a tunnel barrier disposed between the free SAF layer and the pinned SAF layer;
    each of the free and pinned SAF layers comprising opposing magnetic moment vectors, each of the opposing magnetic moment vectors aligned along a magnetic anisotropy easy axis of the memory element in the absence of the first and second H-Fields to define a magnetic state of the element; and
    wherein the moment vectors in the free SAF layer are configured to rotate about the element to corresponding anti-parallel orientations in response to the first and second H-Fields applied in the predetermined arrangement so as to switch the magnetic state of the element.

3. A device according to claim 2, wherein the pinned SAF layer comprises a magnetic fringing field oriented along the magnetic anisotropy easy axis, and configured to apply a bias magnetic field to the moment vectors in the free SAF layer so as to reduce magnitudes of the first and second H-Fields needed to switch the magnetic state of the element when applied to the element in the predetermined arrangement.

4. A device according to claim 3, wherein an orientation of the first H-Field is non-orthogonal to an orientation of the second H-Field, and wherein the first H-Field combines with the bias magnetic field to provide a first applied field to the free SAF layer and the second H-Field combines with the bias magnetic field to provide a second applied field to the free SAF layer, an orientation of the first applied field substantially orthogonal to an orientation of the second applied field.

5. A device according to claim 2, wherein the easy axis passes through acute angles formed by the intersection of the first and second directions.

6. A device according to claim 5, wherein the easy axis bisects the acute angles formed by the intersection of the first and second directions.

7. A device according to claim 2, wherein the predetermined arrangement comprises a sequence of applying only the first write current, followed by applying both the first and second write currents, followed by applying only the second write current, and followed by applying neither write current.

8. A device according to claim 2, further comprising a cladding structure operable to maintain the orientations of the moment vectors in the free SAF layer.

9. An array of magnetoresistive random access memory devices, the array comprising:
    a plurality of magnetoresistive memory elements arranged in rows and columns, and each having a switchable magnetic state;
    first write lines extending along corresponding rows on a first plane;
    second write lines extending along corresponding columns on a second plane that is parallel to the first plane;
    wherein each of the plurality of elements are disposed between corresponding pairs of the first and second write lines in a corresponding intersecting region located where a first write line would non-orthogonally intersect a second write line if located on the same plane; and
    wherein each first write line is configured to provide a first magnetic field (H-Field) to the memory elements when carrying a first write current, and each second write line is configured to provide a second H-Field to the memory elements when carrying a second write current, the first and second H-Fields together sufficient to switch a magnetic state of one of the elements when applied to that element in a predetermined arrangement, and the first and second H-fields each comprising an orientation of less than 45° with respect to a magnetic anisotropic easy axis of each of the corresponding memory elements.

10. An array according to claim 9, wherein one of the first or second write lines comprises staggered write lines, the staggers located between each element along a corresponding row or column.

11. An array according to claim 10, wherein both the first and second write lines comprise staggered write lines, the staggers located between the plurality of elements.

12. An array according to claim 10, wherein the rows and columns of elements are each aligned along straight lines orthogonal to each other.

13. An array according to claim 9, wherein one of the first or second write lines comprises staggered write lines, the staggers located between every other two or more elements along a corresponding row or column.

14. An array according to claim 9, wherein each of the magnetoresistive memory elements is a toggle-mode memory element comprising:
    a free synthetic antiferromagnetic (SAF) layer,
    a pinned SAF layer, and
    a tunnel barrier disposed between the free SAF layer and the pinned SAF layer;
    each of the free and pinned SAF layers comprising opposing magnetic moment vectors, each of the opposing magnetic moment vectors aligned along a magnetic anisotropy easy axis of the memory element in the absence of the first and second H-Fields to define a magnetic state of the element; and
    wherein the moment vectors in the free SAF layer are configured to rotate about the element to corresponding anti-parallel orientations in response to the first and second H-Fields applied in the predetermined arrangement so as to switch the magnetic state of the element.

15. A device according to claim 9, wherein the first, second, or both write lines are in contact with corresponding ones of the plurality of elements in respective intersecting regions.

16. A method of switching a magnetoresistive random access memory device, the method comprising:
    providing a first write current through a first write line in a first direction and on a first plane for applying a first magnetic field (H-Field) to a memory element;
    providing a second write current through a second write line in a second direction and on a second plane that is parallel to the first plane, wherein the second direction is non-orthogonal to the first direction, for applying a second H-Field to the memory element, the first and second H-Fields together sufficient to switch a magnetic state of the element when applied to the element in a predetermined arrangement and the first and second H-fields each comprising an orientation of less than 45° with respect to a magnetic anisotropic easy axis of the memory element; and
    wherein the magnetoresistive memory element is disposed between the first and second write lines in an intersecting region located where the first and second write lines would intersect if located on the same plane.

17. A method according to claim 16, wherein the magnetoresistive memory element is a toggle-mode memory element comprising:
    a free synthetic antiferromagnetic (SAF) layer,
    a pinned SAF layer, and
    a tunnel barrier disposed between the free SAF layer and the pinned SAF layer;
    each of the free and pinned SAF layers comprising opposing magnetic moment vectors, each of the opposing magnetic moment vectors aligned along a magnetic anisotropy easy axis of the memory element in the absence of the first and second H-Fields to define a magnetic state of the element; and
    wherein the method further comprises applying the first and second H-Fields in the predetermined arrangement to switch the magnetic state of the element by rotating the moment vectors in the free SAF layer about the element to corresponding anti-parallel orientations.

18. A method according to claim 17, wherein the pinned SAF layer comprises a magnetic fringing field oriented along the magnetic anisotropy easy axis, and the method further comprises applying a bias magnetic field to the moment vectors in the free SAF layer form the fringing field to reduce magnitudes of the first and second H-Fields needed to switch the magnetic state of the element when applied to the element in the predetermined arrangement.

19. A method according to claim 18, wherein an orientation of the first H-Field is non-orthogonal to an orientation of the second H-Field, and wherein providing the first write current further comprises combing the first H-Field with the bias magnetic field for providing a first applied field to the free SAF layer, and providing the second write current further comprises combining the second H-Field with the bias magnetic field for providing a second applied field to the free SAF layer and having an orientation substantially orthogonal to an orientation of the first applied field.

20. A method according to claim 17, wherein providing the first and second write currents in the predetermined arrangement comprises a sequence of applying only the first write current, followed by applying both the first and second write currents, followed by applying only the second write current, and followed by applying neither write current.

* * * * *